(12) United States Patent
Oki et al.

(10) Patent No.: US 7,928,322 B2
(45) Date of Patent: Apr. 19, 2011

(54) CONDUCTIVE INK, CONDUCTIVE CIRCUIT AND NON-CONTACT MEDIA

(75) Inventors: Tomonori Oki, Tokyo (JP); Takeaki Matsuura, Tokyo (JP); Hiroyuki Tateno, Tokyo (JP)

(73) Assignee: Toyo Ink Mfg. Co., Ltd., Tokyo (JP)

( * ) Notice: Subject to any disclaimer, the term of this patent is extended or adjusted under 35 U.S.C. 154(b) by 86 days.

(21) Appl. No.: 12/447,827

(22) PCT Filed: Oct. 31, 2007

(86) PCT No.: PCT/JP2007/071210
§ 371 (c)(1),
(2), (4) Date: Apr. 29, 2009

(87) PCT Pub. No.: WO2008/053917
PCT Pub. Date: May 8, 2008

(65) Prior Publication Data
US 2010/0051333 A1   Mar. 4, 2010

(30) Foreign Application Priority Data

Nov. 2, 2006   (JP) ................................. 2006-298489

(51) Int. Cl.
*H05K 1/09*   (2006.01)
*C09D 11/10*   (2006.01)

(52) U.S. Cl. ........ 174/257; 427/487; 252/500; 252/514; 106/31.13; 523/160; 523/161

(58) Field of Classification Search .................. 174/257; 427/487; 252/500, 514, 600; 523/160, 161; 106/31.13; 524/603
See application file for complete search history.

(56) References Cited

U.S. PATENT DOCUMENTS

| 6,290,881 | B1 | 9/2001 | Krohn | |
|---|---|---|---|---|
| 7,569,160 | B2 * | 8/2009 | Oldenzijl et al. | 252/500 |
| 2001/0050357 | A1 | 12/2001 | Krohn | |
| 2003/0091751 | A1 | 5/2003 | Tsuruta et al. | |
| 2004/0106718 | A1 | 6/2004 | Krohn | |
| 2007/0128365 | A1 * | 6/2007 | Koch et al. | 427/299 |

FOREIGN PATENT DOCUMENTS

| JP | 2001-064547 | 3/2001 |
|---|---|---|
| JP | 2002-043739 | 2/2002 |
| JP | 2002-072468 | 3/2002 |
| JP | 2002-133944 | 5/2002 |
| JP | 2002-542315 | 12/2002 |
| JP | 2003-110225 | 4/2003 |
| JP | 2003-140330 | 5/2003 |
| JP | 2004-127529 | 4/2004 |
| JP | 2006-219523 | 8/2006 |

OTHER PUBLICATIONS

Metalor-Silver-Flakes (Sep. 13, 2010).*
SF-AA0981 (Sep. 13, 2010).*
SF-AA0101 (Sep. 13, 2010).*

* cited by examiner

*Primary Examiner* — David Wu
*Assistant Examiner* — Vu A Nguyen
(74) *Attorney, Agent, or Firm* — McDermott Will & Emery LLP

(57) ABSTRACT

Disclosed is an active energy ray-curable conductive ink containing a conductive substance and a binder component, which is characterized in that the binder component contains a chlorinated polyester and an active energy ray-polymerizable compound. This active energy ray-curable conductive ink has good fluidity and enables to obtain a conductive circuit with low resistance after curing. Also disclosed are a method for forming a conductive circuit by printing this conductive ink on a substrate, and non-contact media comprising an IC chip mounted in a state electrically connected with the conductive circuit. The conductive substance is preferably a flake powder having a BET specific surface area of 0.1-0.4 $m^2/g$ and an aspect ratio of not less than 3.

6 Claims, No Drawings

CONDUCTIVE INK, CONDUCTIVE CIRCUIT AND NON-CONTACT MEDIA

RELATED APPLICATIONS

This application is the U.S. National Phase under 35 U.S.C. §371 of International Application No. PCT/JP2007/071210, filed on Oct. 31, 2007, which in turn claims the benefit of Japanese Application No. 2006-298489, filed on Nov. 2, 2006, the disclosures of which Applications are incorporated by reference herein.

TECHNICAL FIELD

The present invention relates to an active energy ray-curable conductive ink, a method for forming a conductive circuit with the active energy ray-curable conductive ink, a conductive circuit formed according to the method, and a non-contact media provided with an IC module mounted in a state electrically connected to the conductive circuit. The invention relates to, in more detail, an active energy ray-curable conductive ink being able to form a low resistance conductive circuit even on a substrate less in heat resistant and being excellent in mass productivity of conductive circuits because of instantaneous completion of curing, a method for forming a conductive circuit by printing or coating this conductive ink on the substrate, and a conductive circuit formed according to this method and a non-contact media provided with an IC module mounted in a state electrically connected to this conductive circuit.

BACKGROUND ART

As a method for forming a thin film for electronic components or electromagnetic wave shields or patterning conductive circuits, there are generally known a method where a circuit is printed with a thermo-setting or thermoplastic conductive ink, followed by drying by heating and an etching method using a copper clad substrate.

The etching method is one kind of chemical processes and mainly applied to form a desired pattern shape on a metal surface. However, the etching method is generally problematic because processes thereof are complicated and a waste liquid has to be treated in a back-end step. Further, there is a problem that conductive circuits formed are weak to physical impact such as bending or the like, since the conductive circuits formed by the etching method are composed by only metal such as aluminum, copper or the like.

On the other hand, the conductive ink allows readily forming conductive circuits by printing or coating the conductive ink on a substrate, followed by drying and curing it. Therefore, a demand for the conductive ink is increasing recently from the viewpoint of foaming smaller and lighter electronic component, improving in the productivity or lowering the cost.

A thermosetting conductive ink includes a thermosetting resin and/or an inorganic material such as glass frit as a binder component. The thermosetting conductive ink, accordingly, has to be heated at a high temperature after coating or printing it on a substrate. In curing the thermosetting conductive ink by heating, much energy and time are needed, and a large floor space is also needed for setting units. This is not only uneconomical but also causes a large restriction as shown below.

That is, it is usually needed to heat the conductive ink that contains an inorganic material such as glass frit or the like as a binder component at 800° C. or more for forming a conductive circuit. Therefore, it can not be applied to a synthetic resin substrate. On the other hand, a conductive ink that contains a thermosetting resin as a binder component is applicable to a synthetic resin substrate. However as the conductive ink is needed to heat when cured, deformation of the substrate is caused by the heating in some cases. When a deformed printed wiring circuit is used, there is a problem that troubles are caused when a component is mounted in a following step.

The conductive circuit formed by using a thermoplastic conductive ink is much used in keyboards of personal computers and the like. However, as a substrate such as polyethylene terephthalate shrinks in a drying step of the conductive ink, a pre-treatment of the substrate such as annealing was necessary as countermeasures thereto. Further, it has defects that such a long time as 30 to 60 minutes is needed in the drying step and the conductive circuit obtained is not solvent-resistant.

On the other hand, an active energy ray-curable conductive ink, that is polymerized by irradiation of UV-rays, an electron beam or the like, does not contain or slightly contains a volatile organic solvent, and is cured instantaneously. As it is less in energy consumption, the study of the active energy ray-curable conductive ink is under active state from the viewpoint of reduction of energy consumption and environment preservation.

In recent years, as a method for forming a conductive circuit, there has been tried a method in which a dispersion containing a metal element or a metal element compound is applied on a base material such as a substrate to form a conductive or semi-conductive active energy ray-curable pattern or film and then irradiating it with an active energy ray. In Japanese Patent application laid open (JP-A) No. 2003-140330 there is described a method in which a radical generator is added to a dispersion to eliminate the dispersion and thereby develop the conductivity. Further, JP-A Nos. 2003-140330, 2001-64547, 2002-72468, 2003-110225, 2004-127529 and JP-W No. 2002-542315 describe examples of a conductive ink in which a compound to be cured by an active energy ray as a binder component of a conductive paste is used.

In JP-A No. 2003-110225, the conductive circuit having a volume resistance of an order of $10^{-6}$ Ω·cm is obtained. The conductivity, therefore, is high and further the usage range of the conductive circuit is wide. However, after radicals are generated from a radical generator by irradiation of UV-rays, heating at 250° C. for 30 minutes or more is necessary. From this, it is obvious that a metal therein is sintered by heat at the heating to develop the conductivity in the method described in JP-A No. 2003-110225. Accordingly, the heating at 250° C. or more is inevitable for developing excellent conductivity in this method. The heating step is unfavorable because it damages other electronic components and substrates.

All conductive inks described in JP-A Nos. 2003-140330, 2001-64547, 2002-72468, 2003-110225, 2004-127529 and JP-W No. 2002-542315 are conductive inks in which a composition containing an active energy ray-polymerizable compound is used as a binder. Printed conductive circuits formed by use of these conductive inks are instantaneously cured with an active energy ray such as an electron beam or UV-rays and therefore excellent in the productivity. However, any conductive circuits formed are high in resistance. Further, these documents do not describe a selection procedure of binder components for reducing the value of resistance. Accordingly, from these descriptions, it is insufficient to obtain suggestions for reducing the value of resistance, which is one of objects of the invention.

Furthermore, JP-A No. 2002-43739 discloses a conductive adhesive material in which a chlorinated polyester is used as a charge control agent. However the conductive adhesive material does not contain an active energy ray-polymerizable compound as a binder component. Therefore, when a thermoplastic resin is used as a binder substance, a heat treatment at a melting temperature or more thereof is necessary, and when a thermosetting resin is used, a heat treatment at a curing temperature or more thereof for drying and curing the conductive adhesive material. As the result, the productivity is poor and the economic efficiency is less as well.

DISCLOSURE OF THE INVENTION

Problem to be Solved by the Invention

As described above, a conductive ink cured by irradiation of the active energy ray, that contains a conductive material and an active energy ray-polymerizable compound, had generally higher value of resistance compared with a thermoplastic type. The reason thereof is considered that because the wettability between the active energy ray-polymerizable compound and conductive material is poor, the less contact between conductive materials are occurred.

An object of the present invention is to provide an active energy ray-curable conductive ink that includes a conductive material and an active energy ray-polymerizable compound and is cured by an active energy ray, which is excellent in the fluidity, to form a cured conductive circuit with a low resistance value.

Further, another object of the present invention is to provide a novel active energy ray-curable conductive ink that is capable of forming a conductive circuit by an ordinary printing method such as a screen printing method, a gravure printing method, a flexographic printing method, an offset printing method, an ink jet printing method, a letterpress printing method, an intaglio printing method or the like and contributes to mass productivity, cost-cutting and energy saving; a producing method of a conductive circuit by using this conductive ink; a conductive circuit obtained by this method; and a non-contact media provided with this conductive circuit.

As a result of intensive studies and investigations to overcome the problems described above, the inventors found that when a chlorinated polyester and an active energy ray-polymerizable compound are used as a binder component of a conductive ink used for printing a conductive circuit and the like, a printed matter has no lack and gap of printing ink, a conductive circuit is instantaneously formed by curing using UV-rays, electron beams or the like, and a resistance value of the conductive circuit obtained is low, thus the invention being achieved based on these findings.

That is, a conductive ink of the invention is an active energy ray-curable conductive ink that contains a conductive material and a binder component, wherein the binder component contains a chlorinated polyester and an active energy ray-polymerizable compound.

Further, a method for forming a conductive circuit of the invention includes steps of printing a conductive circuit with the active energy ray-curable conductive ink described above on a substrate and forming a conductive circuit by curing the active energy ray-curable conductive ink by irradiating an active energy ray thereto.

Furthermore, a conductive circuit of the invention is a conductive circuit formed according to the method for forming a conductive circuit described above.

Further, a non-contact media of the invention is a non-contact media obtained by mounting the conductive circuit described above and an IC chip on a base material.

EFFECTS OF THE INVENTION

In the invention, as a chlorinated polyester is used as one component of a binder component in a conductive ink, which contains a conductive material and an active energy ray-polymerizable compound, and is cured by an active energy ray, the wetting properties of the conductive material and the binder component are improved and the fluidity of the conductive ink is also improved. Therefore, a conductive circuit with a low value of resistance can be produced.

In addition, as the conductive ink of the invention has an excellent fluidity, mass production of conductive circuits is realized by an ordinary printing method such as a screen printing method, a gravure printing method, a flexographic printing method, an offset printing method, an ink-jet printing method, a letterpress printing method, or an intaglio printing method. Conductive circuits of the invention which is formed according to the printing methods above are better in productivity, stability to physical impact such as bending or the like and reliability than conductive circuits that are formed only of a metal such as aluminum, copper or the like according to an etching method and the like.

BEST MODE FOR CARRYING OUT THE INVENTION

Hereinafter, the invention will be described in detail with reference to embodiments. However, the invention is not restricted to the embodiments as long as the embodiments do not deviate from technical ideas of the invention.

A conductive ink of the invention is an active energy ray-curable conductive ink containing a conductive material and a binder component, wherein the binder component comprises a chlorinated polyester and an active energy line-polymerizable compound. When a chlorinated polyester is used as the binder component, the fluidity of the conductive ink is improved, the printability thereof becomes very excellent when conductive circuits are formed thereby, precise printing is realized and a resistance of the conductive circuit becomes lower.

The binder components in the invention include an active energy ray-polymerizable compound, a non-polymerizable binder polymer and additives such as a photopolymerization initiator, a photopolymerization inhibitor, a plasticizer, a lubricant, a dispersing agent, a leveling agent, a defoaming agent, an antioxidant, and an anti-sulfuration agent, that is, materials except for a conductive material and a volatile organic solvent in the conductive ink.

The chlorinated polyester in the invention may be either a non-polymerizable binder polymer or an active energy ray polymerizable compound. The chlorinated polyester is commercially available as, for example, chlorinated polyester oligomers CN2201 and CN750 (manufactured by Sartmer Company Inc.), chlorinated polyester-containing polyester acrylate Ebecryl 436, Ebecryl 438, Ebecryl 448, Ebecryl 584 and Ebecryl 586 (manufactured by DAICEL-CYTEC COMPANY LTD.) and the like. In the invention, the commercially available products may be used favorably.

Examples of the conductive material used in the conductive ink of the invention include powders of metal such as gold, silver, copper, silver-plated copper, silver-copper composite, silver-copper alloy, amorphous copper, nickel, chromium, palladium, rhodium, ruthenium, indium, silicon, aluminum, tungsten, molybdenum or platinum, inorganic powders covered with one or more of these metals, powders of metal oxide such as silver oxide, indium oxide, antimony oxide, zinc oxide, tin oxide, antimony-doped tin oxide, ruthenium oxide or indium-tin composite oxide, carbon black, graphite and the like. The conductive materials may be used singularly or in a combination of at least two kinds thereof. Among these, silver is preferred from the viewpoints of the conductivity, the stability of a resistance value to oxidation and the cost.

It is preferred that the conductive material has a BET relative surface area of 0.1 to 0.4 $m^2/g$ and an aspect ratio of 3 or more. Further, it is more preferred that the aspect ratio of the conductive material is 100 or less. When the BET relative surface area is less than 0.1 $m^2/g$, contact points between conductive materials get fewer. Accordingly, the resistance value of the printed conductive circuit becomes higher. On the other hand, when the BET relative surface area exceeds 0.4 $m^2/g$, the thixotropic property of the conductive ink becomes higher and thereby printing becomes difficult. Accordingly, the formation of a precise conductive circuit by printing becomes difficult. Further, when the aspect ratio is less than 3, contact points between conductive materials decrease and the resistance value of the printed conductive circuit becomes higher. On the other hand, when the aspect ratio exceeds 100, UV-rays are shielded to result in poor curability. Furthermore, a middle diameter of a particle is preferably in the range of 0.5 to 20 μm. When the middle diameter of the particle is less than 0.5 μm, the thixotropic property of the conductive ink becomes higher and printing becomes difficult. On the other hand, when the middle diameter of the particle exceeds 20 μm, contact points between conductive materials decrease and thereby the value of resistance becomes higher. A shape of the conductive material may be any one of flake, scale, plate, sphere, substantial sphere, flocculated sphere, dendrite, foil and the like. Among these, flake-like powder is preferred.

The aspect ratio of the conductive material described above is calculated according to the formula: [average major axis] (μm) of the conductive material]/[average thickness (μm) of the conductive material]. At this time, the average major axis (μm) is a value obtained in the following manner. That is, an observation image by a scanning electron microscope is obtained under an appropriate magnification (substantially 2000 times), major axes and thicknesses of 30 or more conductive particles in the observation image are directly observed and then the sum total of major axes are divided by a number of particles to obtain an average value. On the other hand, an average thickness of the conductive material is obtained in such a manner that in the beginning, a sample is produced by solidifying the conductive material with an epoxy resin, a cross-section of the sample is directly observed with a scanning electron microscope (multiplication: 10,000 times) and the sum total of thicknesses of 30 or more conductive material particles in a viewing field is divided by a number of particles to obtain an average value.

A mixing ratio (weight ratio) of the conductive material and the binder component in the conductive ink is that (conductive material): (binder component) is preferably in the range of 60:40 to 95:5 and more preferably in the range of 70:30 to 95:5. When the amount of the conductive material is less than 60%, a small amount of the conductive material leads to less contact between conductive materials to result in a higher value of resistance. On the other hand, when the amount of the conductive material is exceeding 95%, since the amount of binder component is too little, the fluidity of the ink becomes poor and printing becomes difficult, thus it being difficult to obtain a precise conductive circuit.

Furthermore, a volatile organic solvent may be added to control the viscosity of the conductive ink of the invention. As the volatile organic solvent, there may be exemplified ketones, aromatic solvents, alcohols, cellosolves, ether alcohols, esters, aliphatic solvents, and the like. The solvents may be used alone or in a combination of two or more thereof.

Examples of the ketones include acetone, methyl ethyl ketone, methyl isobutyl ketone, 3-pentanone, 2-heptanone, diisobutyl ketone, isophorone, cyclohexanone and the like. Examples of aromatic solvents include benzene, toluene, xylene, ethyl benzene, diethyl benzene, C5 to C20 alkyl benzene, chlorobenzene and the like.

Examples of the alcohols include methanol, ethanol, n-propanol, i-propanol, n-butanol, i-butanol, neopentyl butanol, hexanol, octanol, ethylene glycol, propylene glycol, benzyl alcohol and the like.

Examples of the cellosolves include methyl cellosolve, ethyl cellosolve, butyl cellosolve, hexyl cellosolve and the like.

Examples of the ether alcohols include ethylene glycol monoethyl ether, ethylene glycol monoisopropyl ether, ethylene glycol monobutyl ether, diethylene glycol monoethyl ether, diethylene glycol mono-n-butyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol mono-n-propyl ether and the like.

Examples of the esters include ethyl acetate, butyl acetate, n-cellosolve acetate, butyl carbitol acetate and the like.

Examples of the aliphatic solvents include n-heptane, n-hexane, cyclohexane, methyl cyclohexane, ethyl cyclohexane and the like.

Further, the conductive ink of the invention may contain a non-polymerizable binder polymer to control the viscosity, film forming property, physical property of cured film and the like. The binder polymer preferably has the polymerization degree of 10 to 10,000 or the number average molecular weight of $10^3$ to $10^6$. As the binder polymer, there may be used one or more kind selected from a polyurethane resin, a polyester resin, an alkyd resin, a butyral resin, an acetal resin, a polyamide resin, an acrylic resin, a styrene-acrylic resin, a styrene resin, nitrocellulose, benzyl cellulose, a styrene-maleic anhydride resin, a polybutadiene resin, a poly (vinyl chloride) resin, a poly(vinyl acetate) resin, a fluororesin, a silicone resin, an epoxy resin, a phenol resin, a maleic acid resin, a urea resin, a melamine resin, a benzoguanamine resin, a ketone resin, rosin, a rosin ester, a chlorinated polyolefin resin, a modified chlorinated polyolefin resin, a chlorinated polyurethane resin and the like in accordance with the kind of the printing method, the kind of a substrate used, and the use of a non-contact media.

An active energy ray-polymerizable compound of the invention is a compound having an ethylenically unsaturated double bond. The compound having ethylenically unsaturated double bond contains monomer and oligomers. Examples of the oligomer include polyester (meth)acrylate, polyurethane (meth)acrylate, epoxy (meth)acrylate, unsaturated polyester, vinyl/acrylic oligomer, a maleimide compound and the like.

The typical examples of the monomer used as an active energy ray-polymerizable compound include, but not restricted thereto, (meth) acrylic monomers and acrylic oligomers, which have an ethylenically unsaturated double bond. The term "(meth) acrylic" in the specification generically means acrylic and methacrylic.

In the (meth)acrylic monomer having an ethylenically unsaturated double bond, there are included mono-functional monomers and polyfunctional monomers such as bi- or more polyfunctional monomers. Examples of the mono-functional monomer include alkyl (having 1 to 18 carbon atoms) (meth) acrylate such as methyl(meth)acrylate, ethyl(meth)acrylate, butyl(meth)acrylate, hexyl(meth)acrylate, octyl(meth)acrylate, dodecyl(meth)acrylate, and stearyl(meth)acrylate as well as benzyl(meth)acrylate, (meth)acrylic ester of ethylene oxide adduct of alkyl phenol such as butyl phenol, octyl phenol, nonyl phenol or dodecyl phenol, isobolnyl(meth) acrylate, cyclohexyl(meth)acrylate, and tricyclodecane monomethylol(meth)acrylate.

Examples of the bi-functional monomer include ethylene glycol di(meth)acrylate, diethylene glycol di(meth)acrylate, triethylene glycol di(meth)acrylate, polyethylene glycol di(meth)acrylate, propylene glycol di(meth)acrylate, dipropylene glycol di(meth)acrylate, tripropylene glycol di(meth) acrylate, polypropylene glycol di(meth)acrylate, butylene glycol di(meth)acrylate, pentyl glycol di(meth)acrylate, neopentyl glycol di(meth)acrylate, hydroxy pivaryl hydroxypivarate di(meth)acrylate (commonly called manda), hydroxy pivaryl hydroxypivarate dicaprolactonate di(meth)acrylate, 1,6-hexanediol di(meth)acrylate, 1,2-hexanediol di(meth) acrylate, 1,5-hexanediol di(meth)acrylate, tricyclodecane dimethylol dicaprolactonate di(meth)acrylate, bisphenol A tetraethylene oxide adduct di(meth)acrylate, bisphenol F tetraethylene oxide adduct di(meth)acrylate and the like.

Examples of the tri-functional monomer include glycerin tri(meth)acrylate, trimethylol propane tri(meth)acrylate, trimethylol propane tricaprolactonate tri(meth)acrylate, trimethylol ethane tri(meth)acrylate, trimethylol hexane tri(meth) acrylate, trimethylol octane tri(meth)acrylate, pentaerythritol tri(meth)acrylate and the like.

Examples of the tetra or more-functional monomer include pentaerythritol tetra(meta)acrylate, pentaerythritol tetracaprolactonate tetra(meta)acrylate, diglycerin tetra(meth)acrylate, ditrimethylolpropane tetra(meth)acrylate, ditrimethylolpropane tetracaprolactonate tetra(meth)acrylate, ditrimethylolethane tetra(meth)acrylate, ditrimethylolbutane tetra(meth)acrylate, ditrimethylolhexane tetra(meth)acrylate, ditrimethyloloctane tetra(meth)acrylate, dipentaerythritol penta(meth)acrylate, dipentaerythritol hexa(meth)acrylate, tripentaerythritol hexa(meth)acrylate, tripentaerythritol hepta(meth)acrylate, tripentaerythritol octa(meth)acrylate, pentaerythritol polyalkylene oxide hepta(meth)acrylate and the like.

The active energy ray-curable conductive ink of the invention is printed or coated on a substrate, followed by irradiating an active energy ray to cure. Examples of the active energy ray include UV rays, an electron beam, y rays, infrared rays, visible rays and the like. In the invention, UV rays are preferably used.

When UV rays are used to cure, a photopolymerization initiator is generally added to the conductive ink. Examples of the photopolymerization initiator include benzoin type such as benzoin, benzoin methyl ether, benzoin isopropyl ether, α-acryl benzoin or the like; 2,2-dimethoxy-1,2-diphenylethane-1-one (trade name: IRGACURE 651, manufactured by Ciba Specialty Chemicals), 1-hydroxy-cyclohexyl-phenyl-ketone (trade name: IRGACURE 184, manufactured by Ciba Specialty Chemicals), 2-hydroxy-2-methyl-1-phenyl-propane-1-one (trade name: DAROCURE 1173, manufactured by Ciba Specialty Chemicals), 1-[4-hydroxyethoxy)phenyl]-2-hydroxy-2-methyl-1-propane-1-one (trade name: IRGACURE 2959, manufactured by Ciba Specialty Chemicals), 2-methyl-1-[4-(methylthio)phenyl]-2-morpholinopropane-1-one (trade name: IRGACURE 907, manufactured by Ciba Specialty Chemicals), 2-benzyl-2-dimethylamino-1-(4-morpholinophenyl)-butanone-1 (trade name: IRGACURE 369, manufactured by Ciba Specialty Chemicals), bis(2,4,6-trimethylbenzoyl)phenylphosphine oxide (trade name: IRGACURE 819, manufactured by Ciba Specialty Chemicals), 2,4,6-trimethylbenzoyl-diphenyl-phosphine oxide (trade name: DAROCURE TPO, manufactured by Ciba Specialty Chemicals), 2-hydroxy-1-{4-[4-(2-hydroxy-2-methyl-propyl)-benzyl]-phenyl}-2-methylpropane-1-one (trade name: IRGACURE 127, manufactured by Ciba Specialty Chemicals), 2-dimethylamino-2-(4-methylbenzyl)-1-(4-morpholine-4-yl-phenyl)butane-1-one (trade name: IRGACURE 379, manufactured by Ciba Specialty Chemicals), 2,4-diethylthioxantone (trade name: KAYACURE-DETX-S, manufactured by Nippon Kayaku Co., Ltd.), 2-chlorothioxantone (trade name: KAYACURE-CTX, manufactured by Nippon Kayaku Co., Ltd.), benzophenone (trade name: KAYACURE-BP-100, manufactured by Nippon Kayaku Co., Ltd.), [4-(methylphenylthio)phenyl]phenylmethane (trade name: KAYACURE-BMS, manufactured by Nippon Kayaku Co., Ltd.), ethyl anthraquinone (trade name: KAYACURE-2-EAQ, manufactured by Nippon Kayaku Co., Ltd.), ESA-CURE-KIP100 (manufactured by Nihon Siberhegner K.K.), diethoxyacetophenone, bis(2,6-dimethoxybenzoyl)-2,4,4-trimethyl-pentyl phosphine oxide (trade name: BAPO1, manufactured by Ciba Specialty Chemicals), BTTB (manufactured by Nippon Oil & Fats Co., Ltd.) and the like. The photopolymerization initiator is usually used in the range of 3 to 20 parts by weight and preferably in the range of 5 to 15 parts by weight relative to 100 parts by weight of the active energy ray-polymerizable compound.

The active energy ray-curable conductive ink of the invention is prepared in such a manner that for example, a chlorinated polyester, an active energy ray-polymerizable compound, and if necessary a non-polymerizable binder polymer, additives such as a photopolymerization initiator, a photopolymerization inhibitor, a plasticizer, a lubricant, a dispersing agent, a leveling agent, a defoaming agent, an anti-oxidant, an anti-sulfidizing agent or the like, a solvent and the like are charged in a kneader or the like, stirred and kneaded to a homogeneous composition, followed by adding a conductive material (powder) thereto and kneading it again. A binder component may be used in a solution state by dissolving it in a solvent in advance. The producing method of the active energy ray-curable conductive ink of the invention is not restricted to the method described above. Conventional producing methods of a conductive ink may be appropriately selected and adopted. As the additives such as a photopolymerization inhibitor, a plasticizer, a lubricant, a dispersing agent, a leveling agent, a defoaming agent, an anti-oxidant, an anti-sulfidizing agent and the like, there may be appropriately used those used when conventional printing ink, conductive ink, and active energy ray-curable ink are produced. The ratio of chlorinated polyester, active energy ray-polymerizable compound and non-polymerizable binder polymer varies depending on various conditions such as materials used, a printing method, required conductivity and the like. However, a ratio of chlorinated polyester:active energy ray-polymerizable compound:non-polymerizable binder polymer is usually preferably 10:90:0 to 40:50:10 (by weight ratio). Further, the amount of the solvent may be an extent that imparts appropriate viscosity to the active energy ray-curable conductive ink. The amount of the solvent is usually preferred in the range of 1 to 10 parts by weight relative to 100 parts of a solid content of the ink.

In the invention, a cured conductive circuit is formed by printing a conductive circuit by using an active energy ray-curable conductive ink on a substrate and irradiating an active energy ray thereon. Further, in the case where an area of a conductive film is large or a conductive film is disposed over an entire surface, the active energy ray-curable conductive ink may be coated on a substrate by using known coating machines appropriately. The conductive ink may be printed by use of an ordinary printing method such as a screen printing method, a gravure printing method, a flexographic printing method, an offset printing method, an ink-jet printing method, a letterpress printing method, an intaglio printing method or the like. A conductive circuit formed according to these printing methods is more stable to physical impact such as bending or the like and better in reliability than a conductive circuit that is formed only of a metal such as aluminum, copper or the like according to the etching method.

As the substrate used at the printing, there may be exemplified substrates usually used in the printing such as papers and plastics. Examples of a paper substrate include coated papers, non-coated papers, synthetic papers, polyethylene-coated papers and various kinds of processed papers such as impregnated papers, water-proof processed papers, insulated papers, stretchable papers and the like. Coated papers and processed papers are preferred as substrate of a non-contact media because a stable resistance value can be obtained. Among the coated papers, ones higher in the smoothness are more preferred.

Further, as the plastic substrates, there may be exemplified substrates which are made of plastics usually used in tags or cards such as polyester, polyethylene, polypropylene, cellophane, poly(vinyl chloride), poly(vinylidene chloride), polystyrene, poly(vinyl alcohol), poly(ethylene-vinyl alcohol), nylon, polyimide, polycarbonate or the like. The substrate may be formed into sheet or block.

Before the conductive circuit is printed and formed on the substrate, an anchor coat agent or various kinds of varnish may be coated thereon to improve the adhesiveness of the substrate to the conductive circuit. Further, after the conductive circuit is printed, over print varnish or various kinds of coating agents may be applied on the circuit to protect it. As these varnishes and coating agents, there may be used any of ordinary heating and drying type ones and active energy ray-curable type ones. Further, a non-contact media may be obtained in such a manner that an adhesive is coated on a conductive circuit and then a paper substrate or plastic film on which an image pattern is printed is bonded thereto or a plastic film is laminated by a melt-extrusion method of plastics thereto. Naturally, a substrate on which a sticking agent or an adhesive is coated in advance may be used as a laminating material.

The conductive circuit formed according to the method described above is mounted on a substrate together with an IC module to form a non-contact ID. The substrate is used for holding thereon the conductive circuit and the IC chip, and a paper, a film or the like similar to the substrate for the conductive circuit may be used as the substrate for a non-contact ID. The IC chip writes and stores data and calculates this. The non-contact ID is used as a RFID (Radio Frequency Identification), a non-contact IC card, a non-contact IC tag, a data carrier (recording medium), a wireless card or the like and individual identification or transmission/reception of data between the non-contact ID and readers or readers/writers is carried out by use of a radio wave. Uses thereof include, for example, ID management and history management of a fare collection system, a positional management in a road usage management system and a cargo/baggage tracking and management system, and the like.

Hereinafter, the invention will be specifically described with reference to examples. However, the invention is not restricted to the examples. In examples, "parts" mean parts by weight.

EXAMPLES

Example 1

In the beginning, 70 parts of epoxy oligomer Ebecryl 3700 (manufactured by DAICEL-CYTEC COMPANY LTD.) as an active energy ray-polymerizable compound, 30 parts of chlorinated polyester oligomer CN2201 (manufactured by Sartomer Inc.,), 10 parts of IRUGACURE 907 (manufactured by Ciba Specialty Chemicals) as a photopolymerization initiator and 60 parts of dipropylene glycol monomethyl ether (produced by DAICEL-CYTEC COMPANY LTD.) as a solvent were mixed and stirred using a dissolver until complete dissolution was obtained, thus a binder component 1 being prepared.

Then, 830 parts of AA0981 (manufactured by Metalor Technologies) that is silver powder with a BET relative surface area of 0.23 $m^2/g$ and an aspect ratio of 4.5 as a conductive material was added to the binder component 1, followed by stirring for 15 minutes with a dissolver, and thereby an active energy ray-curable conductive ink 1 was prepared.

Example 2

An active energy ray-curable conductive ink 2 was prepared in the same manner as Example 1 except that chlorinated polyester oligomer CN750 (manufactured by Sartomer Inc.,) was used instead of chlorinated polyester oligomer CN2201 (manufactured by Sartomer Inc.,).

Example 3

An active energy ray-curable conductive ink 3 was prepared in the same manner as Example 1 except that chlorinated polyester oligomer CN736 (manufactured by Sartomer Inc.,) was used instead of chlorinated polyester oligomer CN2201 (manufactured by Sartomer Inc.,).

Example 4

An active energy ray-curable conductive ink 4 was prepared in the same manner as Example 1 except that chlorinated polyester oligomer CN738 (manufactured by Sartomer Inc.,) was used instead of chlorinated polyester oligomer CN2201 (manufactured by Sartomer Inc.,).

Example 5

An active energy ray-curable conductive ink 5 was prepared in the same manner as Example 1 except that chlorinated polyester-containing Ebecryl 438 (manufactured by DAICEL-CYTEC COMPANY LTD.) was used instead of chlorinated polyester oligomer CN2201 (manufactured by Sartomer Inc.,).

Example 6

An active energy ray-curable conductive ink 6 was prepared in the same manner as Example 1 except that chlorinated polyester-containing Ebecryl 446 (manufactured by DAICEL-CYTEC COMPANY LTD.) was used instead of chlorinated polyester oligomer CN2201 (manufactured by Sartomer Inc.,).

Example 7

An active energy ray-curable conductive ink 7 was prepared in the same manner as Example 1 except that chlorinated polyester-containing Ebecryl 584 (manufactured by DAICEL-CYTEC COMPANY LTD.) was used instead of chlorinated polyester oligomer CN2201 (manufactured by Sartomer Inc.,).

Example 8

An active energy ray-curable conductive ink 8 was prepared in the same manner as Example 1 except that chlorinated polyester-containing Ebecryl 586 (manufactured by DAICEL-CYTEC COMPANY LTD.) was used instead of chlorinated polyester oligomer CN2201 (manufactured by Sartomer Inc.,).

Comparative Example 1

An active energy ray-curable conductive ink 9 was prepared in the same manner as Example 1 except that the amount of epoxy oligomer Ebecryl 3700 (manufactured by DAICEL-CYTEC COMPANY LTD.) was changed to 100 parts and chlorinated polyester oligomer CN2201 (manufactured by Sartomer Inc.,) was not used.

Comparative Example 2

An active energy ray-curable conductive ink 10 was prepared in the same manner as Comparative Example 1 except that AgC-B (manufactured by Fukuda Metal Foil & Powder Co., LTD) with a BET relative surface area of 1.6 m²/g and an aspect ratio of 300 was used instead of silver powder AA0981.

(1) Evaluation of Ink Fluidity

The viscosity of the prepared active energy ray-curable conductive ink was measured under an environment of 25° C. with a Brookfield Viscometer RE80H manufactured by Toki Sangyo K. K. at a rotor speed of 2, 5 or 20 revolutions. Values of the viscosity and thixotropy index value (TI value) in the specification are defined as below.

Viscosity: Viscosity at a rotor speed of 5 revolutions
TI value=(viscosity at a rotor speed of 2 revolutions)/(viscosity at a rotor speed of 20 revolutions)

(2) Measurement of Volume Resistance Value

A 50×100 mm conductive pattern was printed with a conductive ink on a polyester film, EMBLET TA manufactured by Unitika Ltd. having a thickness of 100 μm through a silk screen printing plate (screen mesh: #230, line shape: 23 μm), followed by illuminating UV rays under a 160 w/cm air-cooled metal halide lamp at a conveyer speed of 30 m/min. After the film was dried at 80° C. for 30 minutes, the cured conductive pattern was measured with a 4-probe resistance meter, and a volume resistance value was calculated from the sheet resistance obtained and the conductive film thickness.

(3) Evaluation of Printability

A flexografic printing plate (DSF printing plate) being able to form a conductive pattern was mounted on a second unit of a CI 6-colors flexografic press, SOLOFLEX manufactured by Windmoeller & Hoelscher KG and the conductive inks 1 to 9 were sequentially printed with a 165-lines anilox roll having a cell capacity of 25.6 cc/m³ on a single side art paper manufactured by Mitsubishi Seishi K. K. with a thickness of 66 μm at a speed of 70 m/min. Printed matters were evaluated by eyes.

(4) Evaluation of Active Energy Ray Curability

A 50×100 mm pattern was printed with a conductive ink on a polyester film EMBLET TA (trade name) manufactured by Unitika Ltd. having a thickness of 100 μm through a silk screen printing plate (screen mesh: #230, line shape: 23 μm), followed by illuminating UV rays under a 160 w/cm air-cooled metal halide lamp at a conveyer speed of 30 m/min. A cured state of the conductive ink was evaluated by thimble according to the evaluation criteria below;
○: Excellent curability (free from tackiness)
x: Uncured (tacky).

TABLE 1

|  | Example 1 | Example 2 | Example 3 | Example 4 | Example 5 | Example 6 |
| --- | --- | --- | --- | --- | --- | --- |
| Active energy ray-polymerizable compound | Ebecryl 3700 | Ebecryl 3700 | Ebecryl 3700 | Ebecryl 3700 | Ebecryl 3700 | Ebecryl 3700 |
| Parts by weight of active energy ray-polymerizable compound | 70 | 70 | 70 | 70 | 70 | 70 |
| Chlorinated polyester | CN2201 | CN750 | CN736 | CN738 | Ebecryl 438 | Ebecryl 446 |
| Parts by weight of chlorinated polyester | 30 | 30 | 30 | 30 | 30 | 30 |
| Conductive material | AA0981 | AA0981 | AA0981 | AA0981 | AA0981 | AA0981 |
| Parts by weight of conductive material | 830 | 830 | 830 | 830 | 830 | 830 |
| Volatile organic solvent | DPM | DPM | DPM | DPM | DPM | DPM |
| Parts by weight of volatile organic solvent | 60 | 60 | 60 | 60 | 60 | 60 |
| Photopolymerization initiator | IRGACURE 907 | IRGACURE 907 | IRGACURE 907 | IRGACURE 907 | IRGACURE 907 | IRGACURE 907 |
| Parts by weight of photopolymerization initiator | 10 | 10 | 10 | 10 | 10 | 10 |
| Viscocity (Pa/S) | 5.0 | 5.4 | 5.5 | 5.6 | 5.3 | 5.2 |
| TI value | 2.6 | 2.6 | 2.4 | 2.6 | 2.7 | 2.7 |
| Printability | ○ | ○ | ○ | ○ | ○ | ○ |
| Curability | ○ | ○ | ○ | ○ | ○ | ○ |
| Value of volume resistance (Ω/cm) | $5.0 \times 10^{-5}$ | $5.3 \times 10^{-5}$ | $5.2 \times 10^{-5}$ | $5.6 \times 10^{-5}$ | $5.6 \times 10^{-5}$ | $5.9 \times 10^{-5}$ |

TABLE 1-continued

|  | Example 7 | Example 8 | Comparative Example 1 | Comparative Example 2 |
|---|---|---|---|---|
| Active energy ray-polymerizable compound | Ebecryl 3700 | Ebecryl 3700 | Ebecryl 3700 | Ebecryl 3700 |
| Parts by weight of active energy ray-polymerizable compound | 70 | 70 | 100 | 100 |
| Chlorinated polyester | Ebecryl 584 | Ebecryl 586 | none | none |
| Parts by weight of chlorinated polyester | 30 | 30 | 30 | 30 |
| Conductive material | AA0981 | AA0981 | AA0981 | AGC-B |
| Parts by weight of conductive material | 830 | 830 | 830 | 830 |
| Volatile organic solvent | DPM | DPM | DPM | DPM |
| Parts by weight of volatile organic solvent | 60 | 60 | 60 | 60 |
| Photopolymerization initiator | IRGACURE 907 | IRGACURE 907 | IRGACURE 907 | IRGACURE 907 |
| Parts by weight of photopolymerization initiator | 10 | 10 | 10 | 10 |
| Viscocity (Pa/S) | 5.1 | 5.5 | 5.8 | 5.8 |
| TI value | 2.7 | 2.7 | 3.2 | 4.5 |
| Printability | ◯ | ◯ | x | x |
| Curability | ◯ | ◯ | ◯ | x |
| Value of volume resistance (Ω/cm) | $6.2 \times 10^{-5}$ | $6.0 \times 10^{-5}$ | $2.0 \times 10^{-4}$ | — |

As shown in Table 1, the conductive inks 1 to 8 of Examples 1 to 8 that contain a chlorinated polyester showed TI values of 3.0 or less, and were excellent fluidity and good printability. On the contrary, the conductive ink 9 of Comparative Example 1 showed TI value of 3.0 or more and was thixotropic. Therefore lacks and gaps of printing ink were found in the printed matters formed with the conductive ink 9. Further, the printing inks 1 to 8 of Examples 1 to 8 were excellent in the active energy ray curability. In addition the volume resistance values thereof were such low as $10^{-5}$ order. On the other hand, the conductive ink 10 of Comparative Example 2 showed no UV curability and the volume resistance value could not be measured.

INDUSTRIAL APPLICABILITY

According to the present invention, an active energy ray-curable conductive ink with improved fluidity is obtained. As the printability of the conductive ink of the invention is very excellent, fine printing is realized. In addition, a low resistance value of printing circuit is obtained when a conductive circuit is formed using the conductive ink of the invention.

What is claimed is:

1. An active energy ray-curable conductive ink containing a conductive material and a binder component, wherein the conductive material comprises silver and wherein the binder component comprises a chlorinated polyester and an active energy ray-polymerizable compound.

2. The active energy ray-curable conductive ink according to claim 1, wherein the conductive material is flaky powder with a BET relative surface area of 01. to 0.4 m$^2$/g and an aspect ratio of 3 or more.

3. A method for forming a conductive circuit comprising steps of:
   printing a conductive circuit on a substrate with the active energy ray-curable conductive ink according to claim 1; and
   forming a cured conductive circuit by irradiating an active energy ray onto the printed conductive ink.

4. The method for forming a conductive circuit according to claim 3, wherein the printing method of the conductive ink is a screen printing method, a gravure printing method, a flexographic printing method, an offset printing method, an ink-jet printing method, a letterpress printing method, or an intaglio printing method.

5. A printed circuit formed by the method for forming a conductive circuit according to claim 3 or 4.

6. A non-contact media wherein the conductive circuit according to claim 5 and an IC chip are mounted on a substrate.

* * * * *